SEMICONDUCTOR LASER PRODUCING LIGHT AT TWO WAVELENGTHS SIMULTANEOUSLY

Original Filed June 10, 1968

INVENTORS
HENRY KRESSEL AND
FRANK Z. HAWRYLO

BY G. H. Bruestle
ATTORNEY

United States Patent Office

Re. 27,694
Reissued July 3, 1973

27,694

SEMICONDUCTOR LASER PRODUCING LIGHT AT TWO WAVELENGTHS SIMULTANEOUSLY

Henry Kressel, Elizabeth, and Frank Z. Hawrylo, Mercerville, N.J., assignors to RCA Corporation Original No. 3,537,029, dated Oct. 27, 1970, Ser. No. 735,641, June 10, 1968. Application for reissue Mar. 15, 1971, Ser. No. 124,207
Int. Cl. H01s *3/00*
U.S. Cl. 331—94.5 7 Claims

Matter enclosed in heavy brackets [ ] appears in the original patent but forms no part of this reissue specification; matter printed in italics indicates the additions made by reissue.

ABSTRACT OF THE DISCLOSURE

A semiconductor laser comprising adjacent regions of gallium-aluminum arsenide having different aluminum concentrations and different conductivity types. A P-N junction is situated in one of the regions closely adjacent the interface between the regions. The portion of the laser between (i) the P-N junction and (ii) the mechanical interface between the regions has a thickness less than a value on the order of twice the diffusion length for minority carriers in the semiconductor material.

BACKGROUND OF THE INVENTION

This invention relates to the field of light emitting semiconductor devices, and processes for manufacturing the same.

In the manufacture of light emitting semiconductor devices in general, and injection lasers in particular, much effect has been devoted to the manufacture of semiconductor diodes capable of emitting visible coherent or incoherent light. To this end, light emitting P-N junctions have been formed in gallium phosphide and gallium arsenide-phosphide by vapor deposition techniques. These techniques, however, have proven difficult to carry out in practice, and have not permitted accurate control of impurity concentrations and gradients in the vicinity of the P-N junctions.

Since aluminum arsenide has a relatively high energy gap (2.2 ev.) comparable to that of gallium phosphide, some consideration might be given to the manufacture of light emitting semiconductor devices employing this material. However, the hydrophilic nature of this material results in deterioration when exposed to atmospheric conditions at room temperature.

A more suitable material for the manufacture of semiconductor diodes emitting visible light is gallium-aluminum arsenide. Since the crystal lattic constants of aluminum arsenide and gallium arsenide are quite close, lattice mismatch between a gallium-aluminum arsenide epitaxial layer and a gallium arsenide substrate is relatively small so that solution growth techniques, well developed in conjunction with gallium arsenide technology, may be employed for the growth of gallium-aluminum arsenide epitaxial layers on a gallium arsenide substrate.

Prior attempts to grow gallium-aluminum arsenide epitaxial layers on gallium arsenide substrates consisted of forming P-N junctions by a solution growth process in which zinc (an acceptor impurity) was added to a tellurium (donor impurity) doped gallium melt while the solution growth process was taking place. This technique was found to possess a number of severe drawbacks, in that the melts employed could not be reused, planar P-N junctions were difficult to obtain, and it was extremely difficult to control the impurity profile of the resultant graded P-N junction. An abrupt P-N junction could not practically be obtained by this technique.

Accordingly, an object of the present invention is to provide an improved solution growth process for forming a light emitting semiconductor device comprising gallium-aluminum arsenide.

Another object of the invention is to provide a gallium-aluminum arsenide light emitting semiconductor device capable of emitting light at two different wavelengths simultaneously.

Another object of the invention is to provide a light emitting semiconductor device capable of generating coherent radiation in the far infrared range.

SUMMARY OF THE INVENTION

A [multiple wavelength] semiconductor light emitter having first and second contiguous semiconductor regions of mutually different conductivity types. The contiguous regions form a light emitting P-N junction at the interface therebetween. The first semiconductor region has a thin layer of semiconductor material of a given energy gap adjacent the interface. The energy gap of this thin layer is substantially different from that of the remainder of the first region. The thin layer has a thickness less than a value on the order of twice the diffusion length for minority carriers in the layer. The thin layer and the remainder of the first region are capable of emitting light at mutually different wavelengths upon recombination of minority carriers therein.

DETAILED DESCRIPTION

In the solution growth of gallium-aluminum arsenide epitaxial layers having the formula $Ga_{1-x}Al_xAs$, we have found it desirable to prepare the initial melt with an aluminum concentration such that x does not exceed a value on the order of 0.5. Larger aluminum concentrations than this value result in epitaxial layers which are hydrophilic and tend to decompose at room temperature.

It is believed that when x exceeds a value on the order of 0.4, the gallium-aluminum arsenide material exhibits an indirect optical transistion, whereas the material is direct for values of x not exceeding this value. Since efficient light emission is presently obtainable only in direct materials, the aluminum concentration should preferably be such that the value of x does not exceed 0.4 in any of the gallium-aluminum arsenide light emitting epitaxial layers.

Figure 1:
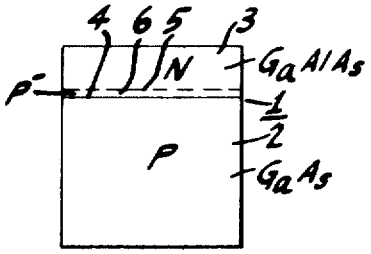
FIG. 1 shows a cross-sectional view of a light emitting semiconductor device according to the invention, at an intermediate stage of manufacture.
Figure 2:
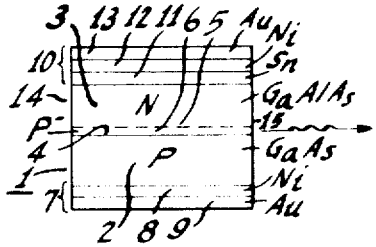
FIG. 2 shows the light emitting device of FIG. 1 upon completion of the manufacturing process.

A diode 1 exhibiting light emission at infrared as well as visible wavelengths is shown in FIGS. 1 and 2. The diode 1 comprises a crystalline P type gallium arsenide substrate 2 having an N type epitaxial gallium-aluminum arsenide layer 3 on one surface thereof. The mechanical interface between the epitaxial layer and the substrate is denoted by the line 4. Acceptor impurities have been diffused, by heat treatment, from the gallium arsenide substrate 2 into the adjacent portion of the gallium-aluminum arsenide epitaxial layer 3 to form a P-N junction 5 within the gallium-aluminum arsenide material.

The portion of the epitaxial layer 3 disposed between the P-N junction 5 and the mechanical interface 4 defines a thin layer of relatively high resistivity (in comparison with the resistivity of the substrate 2) P type gallium-aluminum arsenide material 6, which typically has a thickness on the order of 2 microns. The thickness of the thin layer 6 is substantially less than about twice the diffusion length for minority carriers in the epitaxial layer 3, which diffusion length is on the order of 1 micron at 77° K., and 2 to 3 microns at 300° K. The diffusion length is temperature dependent, as is well known in the art.

The completed diode 1, as shown in FIG. 2, comprises a pair of electrodes in ohmic contact with the gallium arsenide substrate 2 and the gallium aluminum arsenide epitaxial layer 3 respectively. The electrode 7 in contact with the P type gallium arsenide substrate 2 comprises an electroless nickel layer 8 and an overlying electroless gold layer 9. Similarly, the electrode 10 in contact with the N type gallium-aluminum arsenide layer 3 comprises an evaporated thin layer 11 and overlying electroless nickel and gold layers 12 and 13 respectively.

Upon application of a forward bias voltage to the P-N junction 5 via the electrodes 7 and 10, electrons are injected from the N type region 3 into the P type thin layer 6 as well as into the P type substrate 2. Since the thickness of the layer 6 is less than a value on the order of twice the minority carrier diffusion length, substantial electron (minority carrier) injection into the gallium arsenide substrate 2 takes place.

The injected electrons undergo radiative recombination in the layer 6 and the substrate 2, with the net result that infrared light is emitted from the portion of the substrate 2 adjacent the P-N junction 5, while visible light (due to the higher energy gap of gallium-aluminum arsenide) is emitted from the thin layer 6. Both the infrared and the visible light are emitted simultaneously.

Some optical pumping also occurs, i.e. relatively high energy photons generated in the thin gallium-aluminum arsenide layer 6 penetrate into the adjacent portion of the gallium arsenide substrate 2 to impart energy to electrons therein, so that these electrons are "pumped" across the energy gap of the gallium arsenide material. This optical pumping effect increases the infrared light output of the diode 1, and reduces the lasing threshold (for infrared light) when the diode 1 is employed as a laser.

Laser action is obtainable from the diode 1 by application of sufficient voltage between the electrodes 7 and 10 to produce a current density in excess of the lasing threshold value. The end surfaces 14 and 15 of the diode 1 are made optically flat by cleaving or polishing to form an optical cavity. The end surfaces 14 and 15 are substantially normal to the planar P-N junction 5. The end surface 14 is preferably made totally reflecting by means well known in the art, while the end surface 15 is made partially reflecting, so that light is emitted from the surface 15 in the direction indicated by the arrow in FIG. 2.

Tests made on the diode 1, with a zinc doped ($5\times10^{19}$/cc.) gallium arsenide substrate and a tellurium doped ($3\times10^{18}$/cc.) gallium-aluminum arsenide epitaxial layer at room temperature, yielded coherent infrared radiation and noncoherent visible light at a current density on the order of 100,000 amp/cm.$^2$. At 77° K., coherent light was generated simultaneously at infrared and visible wavelengths, under pulsed operation. The visible wavelength at 77° K. was 7,290 Angstroms with a corresponding threshold current density of 3,000 amp/cm.$^2$, while the infrared wavelength was 8,450 Angstroms, with a corresponding threshold current density of 9,400 amp/cm.$^2$. Continuous wave visible laser operation at 6,870 Angstroms was observed at 27° K., with a corresponding threshold current density on the order of 1,000 amp/cm.$^2$.

Since the two optical beams are in the same cavity, mixing of these two wavelengths may occur, with the resultant shorter wavelengths, corresponding to the sum of the (mutually coherent) individual optical frequencies, being almost completely absorbed by the semiconductor material. The longer wavelength, corresponding to the difference between these (mutually coherent) optical frequencies, however, is radiated from the diode. This longer wavelength, which is coherent, lies in the far infrared range and has a value on the order of 10 microns at 77° K. for the diode described above.

Where semiconductor emission of light (the term light is intended to include the near and far infrared and ultraviolet as well as the visible range) at two wavelengths in the visible range is desired, a structure comprising a pair of contiguous epitaxial gallium-aluminum arsenide layers having different aluminum concentrations (to provide different energy gap values) may be employed. Such structures are shown in FIGS. 3 to 6.

Figure 4:
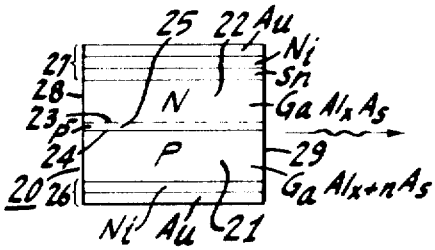
FIG. 4 shows the light emitting device of FIG. 3 after completion of the manufacturing process.
Figure 6:
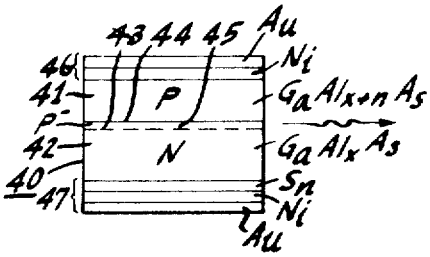
FIG. 6 shows a light emitting device according to FIG. 5 after completion of the manufacturing process.

The completed diode 20 shown in FIG. 4 is similar to that of FIG. 6, with the exception that the aluminum concentration in the P type epitaxial layer is greatest in the vicinity of the P-N junction for the diode shown in FIG. 6; in the diode 20 of FIG. 4, the aluminum concentration in the P type epitaxial layer is lowest in the vicinity of the P-N junction.

Figure 3:
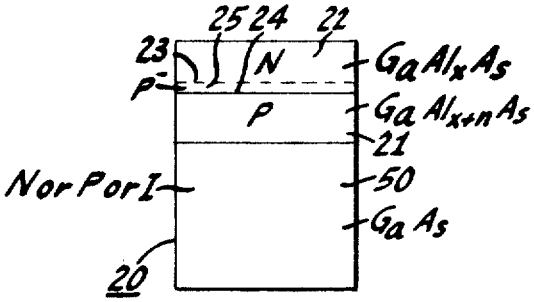
FIG. 3 shows a light emitting semiconductor device according to an alternative embodiment of the invention, at an intermediate stage of manufacture.

The diode 20, shown in partially completed form in FIG. 3 and in complete form in FIG. 4, comprises a P type epitaxial layer 21 of $GaAl_{x+n}As$ and a contiguous N type epitaxial layer 22 of $GaAl_xAs$. Acceptor impurities have been diffused from the P type layer 21 into the adjacent portion of the N type layer 22 to form a P-N junction 23 spaced from the mechanical interface 24 between the layers. The portions of the layer 22 disposed between junction 23 and interface 24 comprise a thin high resistivity (in comparison with the resistivity of the P type layer 21) P type, i.e. a P— layer 25 having a thickness on the order of 2 microns, which is less than twice the diffusion length for minority carriers in the semiconductor material.

While we prefer to main the aluminum concentration in the portion of the P type layer 21 adjacent the interface 24 substantially greater than the aluminum concentration of the thin layer 25, the diode 20 may be constructed with equal aluminum concentrations (n=0) in the adjacent semiconductor regions, or with an aluminum concentration in the region 25 greater than that in the portion of the layer 21 adjacent the interface 24.

The higher the aluminum concentration in the gallium-aluminum aresnide material, the greater the energy gap. Semiconductor material of greater energy gap tends to transmit rather than absorb light of wavelength corresponding to a smaller energy gap. Since the diode 20 generates light in the thin layer 25 and in the portion of the layer 21 adjacent the interface 24, it is desirable that the layer 21 have a higher energy gap, i.e. a higher aluminum concentration, than the layer 22 so that the light generated in the thin layer 25 may be emitted from the semiconductor material with minimal absorption.

Another consequence of providing a higher aluminum concentration in the layer 21 is that the portion of the layer 21 adjacent the interface 24 emits light of shorter wavelength than that emitted by the thin layer 25.

The diode 20 is provided with ohmic electrodes 26 and 27 to the P and N type epitaxial layers 21 and 22, respectively. The electrodes 26 and 27 have a construction similar to that of the corresponding electrodes 7 and 10 of the diode 1.

Upon application of a voltage between the electrodes 26 and 27 to forward bias the P-N junction 23, electrons are injected from the N type layer 22 into the P type layers 25 and 21, where they recombine to emit visible light of two different wavelengths, corresponding to the energy gaps (more precisely, to the energy level differences associated with direct optical transitions) of the associated regions.

The diode 20 is provided with totally reflective end surface 28 and a partially reflective end surface 29, so that light is emitted from the surface 29 in the direction shown by the arrow in FIG. 4. The reflective surfaces 28 and 29, as in the case of the corresponding surfaces 14 and 15 of the diode 1, for an optical cavity.

Upon application of a voltage between the electrodes 26 and 27 of sufficient magnitude to produce a current density in excess of one or both of the lasing thresholds (for the layers 25 and 21 respectively), lasing action occurs with consequent emission of coherent light from the surface 29. Continuous wave operation is achieved at 8040 Angstroms at 27° K., with a corresponding threshold current density on the order of 420 amp/cm.$^2$.

At 77° K., and at a current density on the order of 70,000 to 90,000 amp/cm.$^2$ simultaneous lasing at two different wavelengths in the visible range may be obtained from the diode 20, under pulse operation. Electrical and optical coupling between these two wavelengths renders them mutually coherent, so that optical mixing to provide a longer wavelength (corresponding to the difference between the individual optical frequencies) may take place in the optically nonlinear semiconductor material.

In the diodes shown in FIGS. 2, 4 and 6, the relative intensities and wavelengths of the two optical outputs generated may be varied by changing the operating temperature of the diode. Such a temperature change varies the diffusion length for minority carriers and therefore affects the proportion of the injected electrons which recombine in each of the two (P— and P type) radiating regions.

Figure 5:
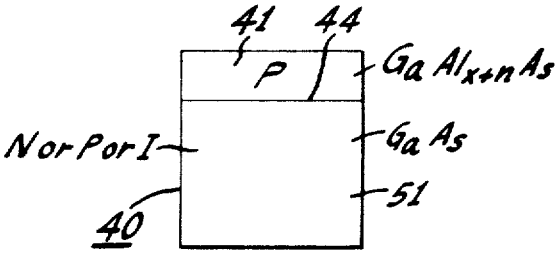
FIG. 5 shows a light emitting semiconductor device according to still another embodiment of the invention, at an intermediate stage of manufacture.

The light emitting diode 40 shown in FIGS. 5 and 6 is, as previously mentioned, similar to the diode 20 shown in FIGS. 3 and 4, differing only in the aluminum concentration profile within the P type region. The diode 40 has adjacent P and N type gallium-aluminum arsenide epitaxial layers 41 and 42, respectively. Acceptor impurities have been diffused from the P type region 41 into the adjacent portion of the N type region 42 to form a P-N junction 43 therein.

The P-N junction 43 is spaced from the mechanical interface 44 between the layers 41 and 42, so that the portion of the layer 42 disposed between junction 43 and interface 44 comprises a thin layer 45 of P— conductivity type having a thickness (on the order of 2 microns) less than a value on the order of twice the diffusion length for minority carriers in the semiconductor material. The diode 40 is provided with electrodes 46 and 47 similar to the electrodes 26 and 27 of the diode 20, respectively.

The diode 40 functions in similar fashion to the diode 20, but, due to its higher aluminum concentration in the portion of the P type layer 41 adjacent the interface 44, operates at shorter wavelengths and with improved efficiency in comparison with the diode 20.

The manufacture of the diode 1 is commenced by preparing the P type monocrystalline gallium arsenide substrate 2 with a clean major surface oriented parallel to the <100> or <111> crystallographic plane. The substrate 2 is initially heavily doped with zinc to a concentration on the order of $5\times10^{19}$/cm.$^3$.

The substrate 2 is then placed in a suitable boat with the cleaned major surface thereof exposed. The wafer 2 is held at one end of the boat by means of a suitable clamp, and the boat is oriented so that the end containing the substrate 2 is tilted upward. A melt comprising 25 grams gallium, 5 grams gallium arsenide, 5 milligrams tellurium and 30 milligrams aluminum is disposed at the lower end of the boat. The melt is heated to a temperature on the order of 920° C., at which time the boat is tipped so that the cleaned surface of the substrate 2 is exposed to the melt.

If desired, selenium or tin, rather than tellurium, may be employed as the donor impurity material.

The melt is then allowed to cool to a temperature on the order of 400° C., at which time the boat is tilted to remove the melt from the surface of the substrate 2, and the substrate is removed from the furnace. During the time the melt cools in the presence of the substrate 2, a gallium-aluminum arsenide alloy is precipitated therefrom to form an epitaxial layer on the substrate 2, the furnace cools from 920° C. to 400° C. in approximately 25 minutes, most of the epitaxial solution growth taking place between the 920° C. temperature and a temperature on the order of 750° C.

The preferred aluminum concentration in the melt may vary from 1 to 250 milligrams (other quantities of melt ingredients than those specified may be employed so long as the proper relative proportions are maintained); we have found that aluminum concentrations in excess of 250 milligrams result in epitaxial deposition of a transparent layer which apparently comprises nearly pure aluminum arsenide.

As previously discussed, aluminum arsenide is unsuitable for practical light emitting diodes, and it is therefore desirable to keep the aluminum concentration below the 250 milligram value. We prefer to maintain the aluminum concentration below 150 milligrams, corresponding to concentrations yielding direct semiconductor material, i.e. material in which optical transitions do not require phonon assistance.

The foregoing process results in an N type epitaxial layer 3 which has a thickness in the range of 1 to 3 mils, and which is doped with tellurium to a concentration on the order of $3\times10^{18}$/cm.$^3$. In order to realize a sharply graded P-N junction which lies within the gallium-aluminum arsenide layer 3, the resultant structure is heat treated at a temperature on the order of 900° C. for a time on the order of 30 minutes. During the heat treatment, zinc diffuses from the substrate 2 into the adjacent portion of the epitaxial layer 3 to form a P-N junction 5 which is situated 1 to 2 microns from the mechanical interface 4 between the epitaxial layer 3 and the gallium arsenide substrate 2.

This heat treatment step may also be carried out simultaneously with the solution growth of the epitaxial layer 3, merely by holding the temperature of the melt at about 900° C. for a period on the order of 15 to 30 minutes while the layer is being grown, and then allowing the melt to cool as previously described.

After the epitaxial layer 3 has been grown, the exposed surface thereof is cleaned, lapped, polished and etched in accordance with techniques well known in the gallium arsenide technology art. The substrate 2, which initially has a thickness on the order of 18 mils, is lapped so that the completed diode 1 has a total thickness on the order of 4 mils. Preferably, the 4 mil final thickness should be equally divided between the remaining portion of the substrate 2 and the epitaxial layer 3.

After lapping of the substrate 2 and cleaning, polishing and etching thereof in accordance with prior art techniques, the electrodes 4 and 7 are deposited on the exposed major surfaces of the P and N type regions. First a thin tin layer 11 is vacuum evaporated onto the exposed surface of the N type layer 3, while maintaining this layer at a temperature on the order of 550° C.

Both surfaces of the wafer are then immersed in (i) an electroless nickel bath followed by (ii) an electroless gold bath to provide the final electrode structure shown in FIG. 2.

The diodes shown in FIGS. 3 and 4 are manufactured by successive growth of P and N type gallium-aluminum arsenide epitaxial layers onto a monocrystalline gallium arsenide substrate 50 having a major surface oriented parallel to the <100> or <111> crystallographic plane. The substrate 50 may be of either conductivity type, or may be substantially intrinsic.

A gallium-aluminum arsenide P type epitaxial layer 21 is deposited, by the solution growth process, onto a cleaned major surface of the substrate 50.

The P type epitaxial layer 21 is formed by precipitation from a melt comprising 25 grams gallium, 5 grams gallium arsenide, 5 grams zinc and 50 milligrams aluminum.

The resultant melt is heated to a temperature on the order of 920° C. and applied to the exposed surface of the gallium arsenide substrate 50. The melt is then allowed to cool to 400° C. over approximately a 25 minute period, at which time the melt is removed from the exposed surface of the substrate 50, and the substrate 50 is removed from the furnace.

The resultant gallium arsenide epitaxial layer 21 is of P type conductivity with a zinc impurity concentration on the order of $5\times10^{19}/cm.^3$.

The thickness of the epitaxial layer 21 is on the order of 1 to 3 mils.

After suitably cleaning the exposed surface of the epitaxial layer 21, a tellurium doped N type epitaxial layer 22 having a thickness on the order of 1 to 3 mils is deposited by the solution growth process onto the exposed surface of the layer 21. The N type epitaxial layer 22 is deposited in the same manner as that employed for deposition of the N type epitaxial layer 3 in conjunction with the manufacture of the diode 1.

The resultant structure is heat treated at 900° C. for (i) 15 to 30 minutes during the solution growth of the epitaxial layer 22, or (ii) 30 minutes after the solution growth of the epitaxial layer 22, to form the P-N junction 23.

The gallium arsenide substrate 50 is next removed by lapping, and ohmic electrodes 26 and 27 are applied to the epitaxial regions 21 and 22, respectively. The electrodes 26 and 27 are formed by methods similar to those employed for formation of the corresponding electrodes 7 and 10 of the diode 1.

Where the substrate 50 is of relatively low resistivity P conductivity type, it may be lapped to a suitable thickness and employed to provide ohmic contact to the adjacent epitaxial layer 21.

The diode 40, shown in FIGS. 5 and 6, is fabricated by similar processes to those previously described. The P type epitaxial layer 41 is grown on a gallium arsenide substrate 51 which is similar to the substrate 50. The solution growth process employed for deposition of the P type gallium-aluminum arsenide epitaxial layer 41 is substantially identical to that employed for deposition of the P type layer 21 of the diode 20.

Due to the solubility vs. temperature characteristics of aluminum in the solution growth melt, the highest concentration of aluminum occurs initially, i.e. at the mechanical interface 44 between the P type epitaxial layer 41 and the gallium arsenide substrate 51 (see FIG. 5).

The next step in manufacturing the diode 40 is the removal of the substrate 51 by lapping, and the cleaning, etching and polishing of the underlying surface of the epitaxial layer 41 (adjacent the interface 44) thereby exposed.

The epitaxial layer 41 is then inverted and placed in the solution growth boat. An N type epitaxial layer 42 is solution grown, by the method previously described for growth of the epitaxial layer 3 of the diode 1, onto the newly exposed P type epitaxial layer 41, so that the interface 44 between the epitaxial layers 41 and 42 is adjacent the portion of the P type layer 41 which has the highest aluminum concentration.

The resultant structure is then cleaned, lapped, polished and etched in accordance with prior art techniques, and ohmic electrodes 46 and 47 are applied to the P and N type epitaxial regions 41 and 42, respectively. The electrodes 46 and 47 are formed according to processes similar to those applied for formation of the electrodes 7 and 4 of the diode 1, respectively.

While the manufacturing processes which have been described above for making the diodes 20 and 41 involve deposition of a P type gallium-aluminum arsenide layer on a gallium arsenide substrate, followed by deposition of an N type gallium-aluminum arsenide layer on the P type layer, the order of deposition of the epitaxial layers may be reversed, other process steps remain the same.

For example, the diode 20 may be prepared by growing an N type epitaxial layer on the gallium arsenide substrate 50, growing a P type layer on the N type layer, and heat treating the resultant structure to drive acceptor impurities from the P type layer into the N type layer to form a P-N junction therein. The gallium arsenide substrate may then be removed or, where the substrate comprises relatively low resistivity N type material, it may be lapped to a suitable thickness and employed to provide ohmic contact to the adjacent N type layer. Similarly, the diode 40 may be manufactured by depositing an N type gallium-aluminum arsenide epitaxial layer on the gallium arsenide substrate 51, removing the substrate 51, and depositing a P type epitaxial layer on the surface of the N type layer which was previously contiguous with the substrate 51. Heat treatment may then be employed, as before, to drive acceptor impurities from the P type layer into the adjacent N type to form a P-N junction therein.

We claim:

1. A semiconductor light emitter, comprising:

first and second contiguous semiconductor regions of mutually different conductivity type forming a light emitting P-N junction at the interface therebetween, said first region having a thin layer of semiconductor material of given energy gap adjacent said P-N junction, the energy gap of said layer being substantially different from the energy gap of the remainder of said first region, said thin layer having a thickness less than a value on the order of twice the diffusion length for minority carriers in said layer, said thin layer and the remainder of said first region being capable of emitting light of mutually different wavelengths upon recombination of minority carriers therein.

2. A light emitter according to claim 1, said emitter generating coherent light at at least one of said wavelengths, further comprising an optical cavity having reflective surfaces substantially normal to said P-N junction, said junction being substantially planar.

[3. A multiple wavelength light emitter according to claim 2, wherein said emitter generates coherent light at each of said mutually different wavelengths, further comprising optically nonlinear means for mixing said mutually different wavelengths to produce coherent radiation at a given wavelength different from either of said mutually different wavelengths.

4. A multiple wavelength light emitter according to claim 3, wherein the semiconductor material of said emitter serves as said optically nonlinear means.

5. A multiple wavelength light emitter according to claim 1, wherein said thin layer comprises gallium-aluminum arsenide.]

6. A light emitter according to claim [5] *10*, wherein said second region comprises gallium-aluminum arsenide.

7. A light emitter according to claim 6, wherein said remainder of said first region comprises gallium-aluminum arsenide or gallium arsenide.

8. A light emitter according to claim [5] 10 wherein said thin layer comprises gallium-aluminum arsenide having the formula $Ga_{1-x}Al_xAs$, where x does not exceed a value on the order of 0.4.

*9. A light emitter according to claim 10 wherein said remainder of said first region comprises gallium-aluminum arsenide and has an energy gap greater than that of said thin layer.*

*10. A semiconductor light emitter, comprising:*

*first and second contiguous semiconductor regions of mutually different conductivity type forming a light emitting P-N junction at the interface therebetween,*

*said first region having a thin layer of gallium-aluminum arsenide semiconductor material of given en-*

*energy gap adjacent said P-N junction,*

*the energy gap of said layer being substantially different from the energy gap of the remainder of said first region, said thin layer having a thickness less than a value on the order of twice the diffusion length for minority carriers in said layer,*

*said thin layer and the remainder of said first region being capable of emitting light of mutually different wavelengths upon recombination of minority carriers therein.*

References Cited

The following references, cited by the Examiner, are of record in patented file of this patent or the original patent.

UNITED STATES PATENTS

| | | | |
|---|---|---|---|
| 3,245,002 | 4/1966 | Hall | 331—94.5 |
| 3,300,671 | 1/1967 | Woodbury | 313—108 |
| 3,309,553 | 3/1967 | Kroemer | 313—108 |
| 3,387,163 | 6/1968 | Queisser | 313—108 |
| 3,412,344 | 11/1968 | Pankove | 331—94.5 |
| 3,456,209 | 7/1969 | Diemer | 331—94.5 |
| 3,501,679 | 3/1970 | Yonezu et al. | 317—234 |

OTHER REFERENCES

Alferov et al.: "High-Voltage P-N Junctions in $Ga_xAl_{1-x}As$ Crystals," Chemical Abstracts, vol. 69, 1968, abstract No. 62840g.

Rupprecht et al.: "Efficient Visible Electroluminescence at 300° K. From $Ga_{1-x}Al_xAs$ P-N Junction Grown by Liquid-Phase Epitaxy," Applied Physics Letters, vol. 11, pp. 81–83, Aug. 1, 1967.

Susaki: "Lasing Action in $(Ga_{1-x}Al_x)As$ Diodes," IEEE Journal of Quantum Electronics, vol. QE–4, pp. 422–424, June 1968.

Rupprecht et al.: "Stimulated Emission From $Ga_{1-x}Al_xAs$ Diodes at 77° K.," IEEE Jour. of Quant. Elect., vol. QE–4, January 1968.

Parrish et al.: "A Technique for the Preparation of Low-Threshold Room Temperature GaAs Laser Diode Structures," IEEE Jour. of Quant. Elect., vol. QE–5, p. 210.

Hayashi et al.: A Low-Threshold Room temperature Injection Laser," IEEE Jour. of Quant. Elect., vol. QE–5, p. 211, April 1969.

Nelson et al.: "Improved Red and Infrared Light Emitting Laser Diodes Using the Close Confinement Structure," Applied Physics Letters, vol. 15, pp. 7–9, July 1969.

EDWARD S. BAUER, Primary Examiner

U.S. Cl. X.R.

317—234 R